United States Patent
Takagi

(10) Patent No.: US 10,520,801 B2
(45) Date of Patent: Dec. 31, 2019

(54) WAVELENGTH CONVERSION ELEMENT, METHOD FOR MANUFACTURING WAVELENGTH CONVERSION ELEMENT, LIGHT SOURCE APPARATUS, AND PROJECTOR

(71) Applicant: SEIKO EPSON CORPORATION, Tokyo (JP)

(72) Inventor: Kunihiko Takagi, Okaya (JP)

(73) Assignee: SEIKO EPSON CORPORATION, Tokyo (JP)

(*) Notice: Subject to any disclaimer, the term of this patent is extended or adjusted under 35 U.S.C. 154(b) by 0 days.

(21) Appl. No.: 16/217,110

(22) Filed: Dec. 12, 2018

(65) Prior Publication Data
US 2019/0179219 A1 Jun. 13, 2019

(30) Foreign Application Priority Data
Dec. 13, 2017 (JP) .................... 2017-238796

(51) Int. Cl.
| | |
|---|---|
| *G03B 21/20* | (2006.01) |
| *G03B 21/00* | (2006.01) |
| *B32B 37/18* | (2006.01) |
| *B32B 38/00* | (2006.01) |
| *B32B 7/12* | (2006.01) |

(52) U.S. Cl.
CPC ............. *G03B 21/204* (2013.01); *B32B 7/12* (2013.01); *B32B 37/18* (2013.01); *B32B 38/0004* (2013.01); *G03B 21/006* (2013.01); *G03B 21/2066* (2013.01); *B32B 2551/00* (2013.01)

(58) Field of Classification Search
CPC .. G03B 21/006; G03B 21/145; G03B 21/204; G03B 21/208; G03B 21/2013; G03B 21/2033; G03B 21/2066; C09K 11/774; C09K 11/7721; C09K 11/7734; C09K 11/7735; C09K 11/7738; C09K 11/7774; C09K 11/7775; C09K 11/7781; C09K 11/7789; C09K 11/7794; C09K 11/7795;
(Continued)

(56) References Cited

U.S. PATENT DOCUMENTS

| | | | |
|---|---|---|---|
| 2015/0205189 A1* | 7/2015 | Nojima | ................... H01L 33/50 353/31 |
| 2016/0138766 A1 | 5/2016 | Owada | |
| 2019/0072244 A1* | 3/2019 | Masuda | ................... F21V 7/22 |

FOREIGN PATENT DOCUMENTS

JP          2016-100090 A        5/2016

* cited by examiner

*Primary Examiner* — Sultan Chowdhury
(74) *Attorney, Agent, or Firm* — Oliff PLC

(57) ABSTRACT

The invention relates to a wavelength conversion element including a wavelength conversion layer having a first surface including an excitation light irradiated region irradiated with excitation light and a second surface being opposed to the first surface, the wavelength conversion layer wavelength-converting the excitation light into converted light having a wavelength different from the wavelength of the excitation light, a reflection member provided on a portion of the second surface, the reflection member including an inorganic oxide layer and reflecting the excitation light and the converted light, a first layer disposed in a first region that faces the reflection member and in a second region that does not face the reflection member on the second surface of the wavelength conversion layer, a bonding material so provided as to face the first layer, and a base bonded to the first layer via the bonding material.

10 Claims, 9 Drawing Sheets

(58) Field of Classification Search
CPC ....... H01L 33/02; H01L 33/005; H01L 33/50; H01L 33/05; H01L 33/54; H01L 33/60
See application file for complete search history.

WAVELENGTH CONVERSION ELEMENT, METHOD FOR MANUFACTURING WAVELENGTH CONVERSION ELEMENT, LIGHT SOURCE APPARATUS, AND PROJECTOR

BACKGROUND

1. Technical Field

The present invention relates to a wavelength conversion element, a method for manufacturing the wavelength conversion element, a light source apparatus, and a projector.

2. Related Art

For example, JP-A-2016-100090 discloses a light source apparatus including a light source that outputs laser light and a wavelength conversion element that emits fluorescence when the laser light is incident thereon. In the light source apparatus, the wavelength conversion element includes a phosphor layer, a substrate that supports the phosphor layer, and a reflection layer provided between the substrate and the phosphor layer.

Since the fluorescence conversion efficiency of the phosphor layer decreases when the temperature thereof increases, it is important for improvement in the fluorescence conversion efficiency to efficiently dissipate heat from the phosphor layer to the substrate. However, in the light source apparatus described above, the reflection layer is provided across a surface of the phosphor layer that is the surface facing the substrate, resulting in a problem of a difficulty in efficiently transferring the heat in the phosphor layer to the substrate.

Further, the phosphor layer is manufactured in a dicing process in which a phosphor substrate on which the reflection layer is formed is cut into parts each having a predetermined size. The dicing process may cause the reflection layer to separate from the phosphor layer, resulting in a problem of a decrease in the yield of the phosphor layer.

To avoid the problem described above, it is conceivable to employ a wavelength conversion element manufacturing method including cutting a phosphor substrate in advance into a plurality of phosphor layers each having a predetermined size and forming a reflection layer on each of the cut phosphor layers. The manufacturing method described above, however, requires the phosphor layers to each be placed in a film formation apparatus, and it is therefore difficult to efficiently manufacture the wavelength conversion elements.

SUMMARY

An advantage of some aspects of the invention is to provide a wavelength conversion element that excels in thermal conductivity. Another advantage of some aspects of the invention is to provide a wavelength conversion element manufacturing method that allows suppression of a decrease in manufacturing efficiency. Another advantage of some aspects of the invention is to provide a light source apparatus including the wavelength conversion element. Another advantage of some aspects of the invention is to provide a projector including the light source apparatus.

According to a first aspect of the invention, there is provided a wavelength conversion element including a wavelength conversion layer having a first surface including an excitation light irradiated region irradiated with excitation light and a second surface being opposed to the first surface, the wavelength conversion layer wavelength-converting the excitation light into converted light having a wavelength different from a wavelength of the excitation light, a reflection member provided on a portion of the second surface that is a portion including a region that coincides in a plan view with the excitation light irradiated region when the first surface is viewed in a direction of a normal thereto, the reflection member including an inorganic oxide layer and reflecting the excitation light and the converted light, a first layer disposed not only in a first region that faces the reflection member but on the second surface of the wavelength conversion layer and in a second region that does not face the reflection member, a bonding material so provided as to face the first layer, and a base bonded to the first layer via the bonding material.

The wavelength conversion element according to the first aspect has the second region, where no reflection member is provided between the second surface of the wavelength conversion layer and the base. In the second region, the wavelength conversion layer is bonded to the base via the first layer and the bonding material, whereby heat in the wavelength conversion layer is efficiently dissipated toward the base via the first layer and the bonding material. The thermal conductivity of the wavelength conversion layer can therefore be improved.

The heat in the wavelength conversion layer and the reflection member is therefore efficiently transferred toward the base as compared with a configuration in which the reflection member is provided across the second surface. The configuration according to the first aspect of the invention therefore suppresses a decrease in the light conversion efficiency due to an increase in the temperature of the wavelength conversion layer, whereby high-illuminance converted light can be produced.

In the first aspect described above, it is preferable that the first layer is so provided as to extend from the first region via a side surface of the reflection member to the second region.

According to the configuration described above, the first layer is satisfactorily disposed at the corners of the reflection member (portion where first region is connected to side surface or portion where side surface is connected to second surface). The bonding material is therefore satisfactorily bonded to the corners of the reflection member via the first layer. A large area where the reflection member is bonded to the first layer can therefore be ensured. The heat of the reflection member is therefore likely to be dissipated toward the base via the first layer and the bonding material. That is, the heat dissipation performance of the reflection member is improved.

According to a second aspect of the invention, there is provided a light source apparatus including the wavelength conversion element according to the first aspect described above and a light source that outputs light toward the wavelength conversion element.

The light source apparatus according to the second aspect, which uses the wavelength conversion element that allows suppression of a decrease in the efficiency of extraction of the wavelength-converted light, allows reduction in the loss of the wavelength-converted light.

According to a third aspect of the invention, there is provided a projector including the light source apparatus according to the second aspect described above, a light modulator that modulates light from the light source apparatus in accordance with image information to form image light, and a projection system that projects the image light.

The projector according to the third aspect, which includes the light source apparatus according to the second aspect described above, can form a high-luminance image.

According to a fourth aspect of the invention, there is provided a method for forming a wavelength conversion element, the method including a reflection member formation step of forming a plurality of reflection members on one surface of a wavelength conversion member formation substrate including wavelength conversion particles that wavelength-convert excitation light, the reflection members reflecting the excitation light and light into which the excitation light is wavelength-converted by the wavelength conversion particles, a first layer formation step of forming a first layer not only in a third region that faces the reflection member but on the one surface of the wavelength conversion member formation substrate and in a fourth region that does not face the reflection member, a cutting step of cutting the wavelength conversion member formation substrate at gaps provided between the plurality of reflection members to form a plurality of wavelength conversion members, and a bonding step of bonding each of the wavelength conversion members to a base via a bonding material.

The wavelength conversion element manufacturing method according to the fourth aspect, in which the gaps between the reflection members are cut in the cutting step, can prevent separation of the reflection members in the cutting step. A decrease in the yield of the wavelength conversion elements due to the separation of the reflection members can therefore be suppressed.

In a case where the first layer and the reflection member are individually formed on each of a plurality of wavelength conversion layers cut in advance, the wavelength conversion layers each need to be placed in a film formation apparatus. It is therefore difficult to efficiently manufacture the wavelength conversion elements.

In contrast, in the present manufacturing method, after the first layers and the reflection members are formed on the wavelength conversion member formation substrate, the base is bonded to each of the wavelength conversion members, which are produced by cutting the wavelength conversion member formation substrate, whereby the wavelength conversion elements can be efficiently manufactured.

In the fourth aspect described above, it is preferable that in the first layer formation step, the first layer is so formed as to extend from the third region via a side surface of the reflection member to the fourth region.

According to the configuration described above, since the side surface of each of the reflection members is covered with the first layer, damage of the side surface of each of the reflection members due to chips produced in the cutting step and other problems can be avoided.

In the fourth aspect described above, it is preferable that in the bonding step, a metal material is used as a material of the bonding material, and that in the first layer formation step, a metal material is used as a material of the first layer and the first layer is formed across the fourth region.

According to the configuration described above, the first layer is cut when the wavelength conversion member formation substrate is cut. Since the first layer made of a metal material has smaller film stress than the reflection members each including an inorganic oxide layer, separation between the first layer and the reflection members is unlikely to occur even when the first layer and the wavelength conversion member formation substrate are cut together. A decrease in the yield of the wavelength conversion elements due to the separation can therefore be suppressed. Since the first layer is formed on the entire forth region, no mask for patterning the first layer is required in the first layer formation step, whereby the manufacturing steps can be simplified.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
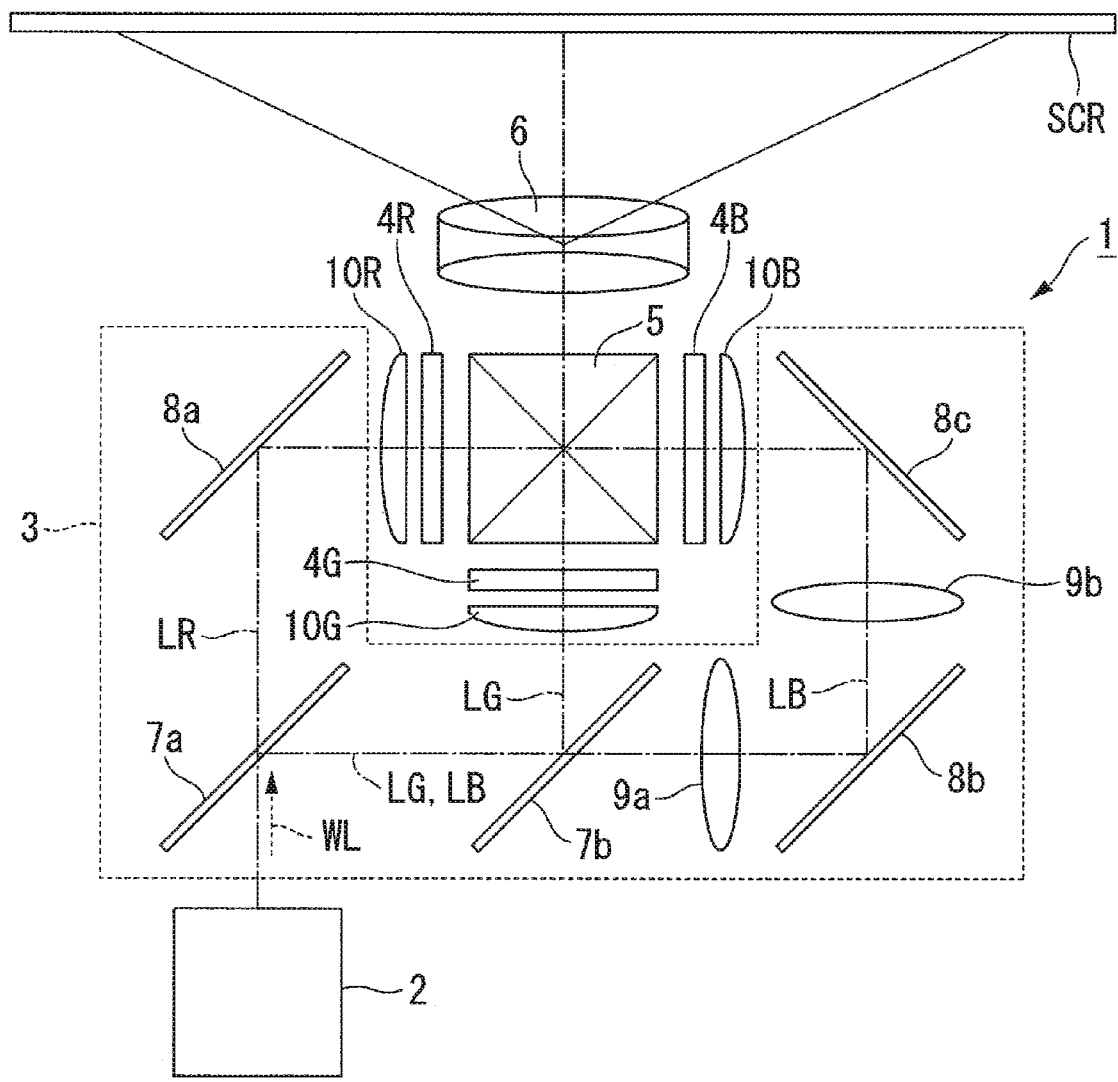
FIG. 1 shows the configuration of a projector according to a first embodiment.

Embodiments of the invention will be described below in detail with reference to the drawings.

In the drawings used in the following description, a characteristic portion is enlarged for convenience in some cases for clarity of the characteristic thereof, and the dimension ratio and other factors of each component are therefore not always equal to actual values.

First Embodiment

An example of a projector according to a first embodiment of the invention will first be descried.

FIG. 1 shows a schematic configuration of the projector according to the present embodiment.

A projector 1 according to the present embodiment is a projection-type image display apparatus that displays color video images on a screen SCR, as shown in FIG. 1. The projector 1 includes an illuminator 2, a color separation system 3, a light modulator 4R, a light modulator 4G, a light modulator 4B, a light combining system 5, and a projection system 6.

The color separation system 3 separates illumination light WL into red light LR, green light LG, and blue light LB. The color separation system 3 generally includes a first dichroic mirror 7a and a second dichroic mirror 7b, a first total reflection mirror 8a, a second total reflection mirror 8b, and a third total reflection mirror 8c, and a first relay lens 9a and a second relay lens 9b.

The first dichroic mirror 7a separates the illumination light WL from the illuminator 2 into the red light LR and the other light (green light LG and blue light LB). The first dichroic mirror 7a transmits the separated red light LR and reflects the other light (green light LG and blue light LB). On the other hand, the second dichroic mirror 7b reflects the green light LG and transmits the blue light LB to separate the other light into the green light LG and the blue light LB.

The first total reflection mirror 8a is disposed in the optical path of the red light LR and reflects the red light LR having passed through the first dichroic mirror 7a toward the light modulator 4R. On the other hand, the second total reflection mirror 8b and the third total reflection mirror 8c are disposed in the optical path of the blue light LB and guide the blue light LB having passed through the second dichroic mirror 7b to the light modulator 4B. The green light LG is reflected off the second dichroic mirror 7b toward the light modulator 4G.

The first relay lens 9a and the second relay lens 9b are disposed in the optical path of the blue light LB and on the downstream side of the second dichroic mirror 7b.

The light modulator 4R modulates the red light LR in accordance with image information to form image light corresponding to the red light LR. The light modulator 4G modulates the green light LG in accordance with image information to form image light corresponding to the green light LG. The light modulator 4B modulates the blue light LB in accordance with image information to form image light corresponding to the blue light LB.

The light modulators 4R, 4G, and 4B are each formed, for example, of a transmissive liquid crystal panel. Polarizers (not shown) are disposed on the light incident side and the light exiting side of each of the liquid crystal panels.

Field lenses 10R, 10G, and 10B are disposed on the light incident side of the light modulators 4R, 4G, and 4B, respectively. The field lenses 10R, 10G, and 10B parallelize the red light LR, the green light LG, and the blue light LB incident on the light modulators 4R, 4G, and 4B, respectively.

The image light fluxes from the light modulators 4R, 4G, and 4B enter the light combining system 5. The light combining system 5 combines the image light fluxes corresponding to the red light LR, the green light LG, and the blue light LB with one another and causes the combined image light to exit toward the projection system 6. The light combining system 5 is formed, for example, of a cross dichroic prism.

The projection system 6 is formed of a projection lens group, enlarges the combined image light from the light combining system 5, and projects the enlarged image light toward the screen SCR. Enlarged color video images are thus displayed on the screen SCR.

Illuminator

Figure 2:
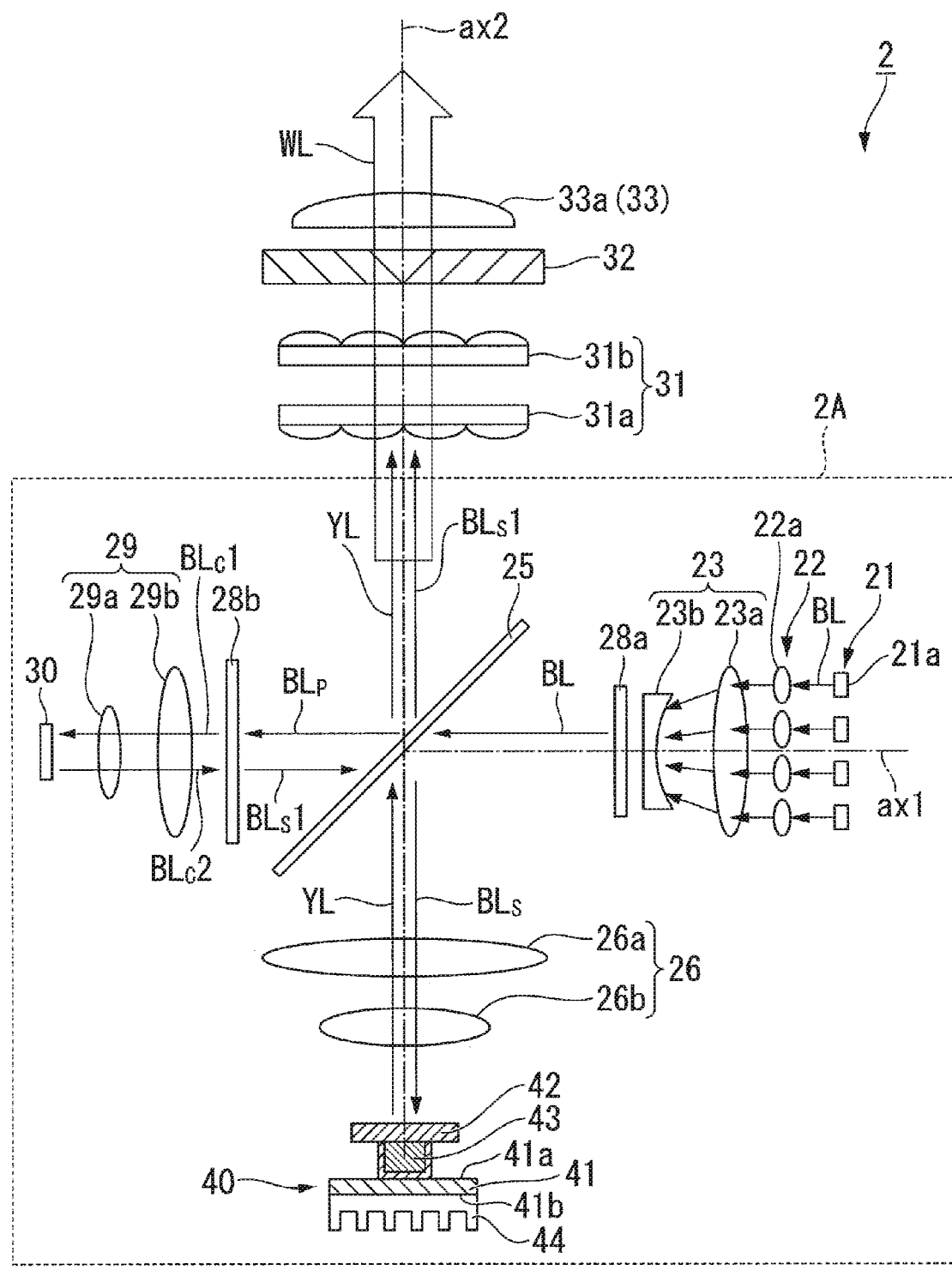
FIG. 2 shows the configuration of an illuminator.

The illuminator 2 will subsequently be described. FIG. 2 shows a schematic configuration of the illuminator 2. The illuminator 2 includes a light source apparatus 2A according to an embodiment of the invention, an optical integration system 31, a polarization conversion element 32, and a superimposing lens 33a, as shown in FIG. 2. In the present embodiment, the optical integration system 31 and the superimposing lens 33a form a superimposing system 33.

The light source apparatus 2A includes an array light source 21, a collimator system 22, an afocal system 23, a first retardation film 28a, a polarization separation element 25, a first light collection system 26, a wavelength conversion element 40, a second retardation film 28b, a second light collection system 29, and a diffusive reflection element 30.

The array light source 21, the collimator system 22, the afocal system 23, the first retardation film 28a, the polarization separation element 25, the second retardation film 28b, the second light collection system 29, and the diffusive reflection element 30 are sequentially arranged along an optical axis ax1. On the other hand, the wavelength conversion element 40, the first light collection system 26, the polarization separation element 25, the optical integration system 31, the polarization conversion element 32, and the superimposing lens 33a are sequentially arranged along an illumination optical axis ax2. The optical axis ax1 and the illumination optical axis ax2 are present in the same plane and perpendicular to each other.

The array light source 21 includes a plurality of semiconductor lasers 21a, which each serve as a solid-state light source. The plurality of semiconductor lasers 21a are arranged in an array in a plane perpendicular to the optical axis ax1.

The semiconductor lasers 21a each output, for example, a blue light beam BL (laser light having intensity that peaks at wavelength of 460 nm, for example). The array light source 21 outputs a light beam flux formed of a plurality of light beams BL. In the present embodiment, the array light source 21 corresponds to the "light source" in the appended claims.

The light beams BL outputted from the array light source 21 enter the collimator system 22. The collimator system 22 converts the light beams BL outputted from the array light source 21 into parallelized light. The collimator system 22 is formed, for example, of a plurality of collimator lenses 22a arranged in an array. The plurality of collimator lenses 22a are disposed in correspondence with the plurality of semiconductor lasers 21a.

The light beams BL having passed through the collimator system 22 enter the afocal system 23. The afocal system 23 adjusts the light flux diameter of each of the light beams BL. The afocal system 23 is formed, for example, of a convex lens 23a and a concave lens 23b.

The light beams BL having passed through the afocal system 23 are incident on the first retardation film 28a. The first retardation film 28a is, for example, a half wave plate configured to be rotatable. The light beams BL outputted from the semiconductor lasers 21a are each linearly polarized light. Appropriately setting the angle of rotation of the first retardation film 28a allows each of the light beams BL having passed through the first retardation film 28a to be a light beam containing an S-polarized component and a P-polarized component with respect to the polarization separation element 25 mixed with each other at a predetermined ratio. The ratio between the S-polarized component and the P-polarized component can be changed by rotating the first retardation film 28a.

The light beams BL each containing the S-polarized component and the P-polarized component produced when the light beam BL passes through the first retardation film 28a are incident on the polarization separation element 25. The polarization separation element 25 is formed, for example, of a polarizing beam splitter having wavelength selectivity. The polarization separation element 25 inclines by 45° with respect to the optical axis ax1 and the illumination optical axis ax2.

The polarization separation element 25 has a polarization separation function of separating each of the light beams BL into a light beam $BL_S$, which is formed of the S-polarized light component with respect to the polarization separation element 25, and a light beam $BL_P$, which is formed of the P-polarized light component with respect to the polarization separation element 25. Specifically, the polarization separation element 25 reflects the light beams $BL_S$, which are each formed of the S-polarized light component, and transmits the light beams $BL_P$, which are each formed of the P-polarized light component.

The polarization separation element 25 further has a color separation function of transmitting fluorescence YL, which belongs to a wavelength band different from the wavelength band to which the light beams BL belong, irrespective of the polarization state of the fluorescence YL.

The S-polarized light beams $BL_S$ emitted from the polarization separation element 25 enter the first light collection system 26. The first light collection system 26 collects the light beams $BL_S$ and directs the collected light beams $BL_S$ toward the wavelength conversion element 40.

In the present embodiment, the first light collection system 26 is formed, for example, of a first lens 26a and a second lens 26b. The light beams $BL_S$ having exited out of the first light collection system 26 are incident in the form of a collected light flux on the wavelength conversion element 40.

The fluorescence YL produced by the wavelength conversion element 40 is parallelized by the first light collection system 26 and then incident on the polarization separation element 25. The fluorescence YL passes through the polarization separation element 25.

On the other hand, the P-polarized light beams $BL_P$ having exited out of the polarization separation element 25 are incident on the second retardation film 28b. The second retardation film 28b is formed of a quarter wave plate disposed in the optical path between the polarization separation element 25 and the diffusive reflection element 30. The P-polarized light beams $BL_P$ having exited out of the polarization separation element 25 are converted by the second retardation film 28b, for example, into right-handed circularly polarized blue light $BL_C1$, which then enters the second light collection system 29.

The second light collection system 29 is formed, for example, of a convex lens 29a and a concave lens 29b and causes the collected blue light $BL_C1$ to be incident on the diffusive reflection element 30.

The diffusive reflection element 30 is disposed on the side opposite a phosphor layer 42 with respect to the polarization separation element 25 and diffusively reflects the blue light $BL_C1$ having exited out of the second light collection system 29 toward the polarization separation element 25. The diffusive reflection element 30 preferably not only reflects the blue light $BL_C1$ in a Lambertian reflection scheme but does not disturb the polarization state of the blue light $BL_C1$.

The light diffusively reflected off the diffusive reflection element 30 is hereinafter referred to as blue light $BL_C2$. According to the present embodiment, diffusively reflecting the blue light $BL_C1$ results in blue light $BL_C2$ having a roughly uniform illuminance distribution. For example, the right-handed circularly polarized blue light $BL_C1$ is reflected in the form of left-handed circularly polarized blue light $BL_C2$.

The blue light $BL_C2$ is converted by the second light collection system 29 into parallelized light and then incident on the second retardation film 28b again.

The left-handed circularly polarized blue light $BL_C2$ is converted by the second retardation film 28b into S-polarized blue light $BL_S1$. The S-polarized blue light $BL_S1$ is reflected off the polarization separation element 25 toward the optical integration system 31.

The blue light $BL_S1$ is thus used as the illumination light WL along with the fluorescence YL having passed through the polarization separation element 25. That is, the blue light $BL_S1$ and the fluorescence YL exit out of the polarization separation element 25 in the same direction to form the white illumination light WL, which is the mixture of the blue light $BL_S1$ and the fluorescence (yellow light) YL.

The illumination light WL exits toward the optical integration system 31. The optical integration system 31 is formed, for example, of a lens array 31a and a lens array 31b. The lens arrays 31a and 31b are each formed of a plurality of lenslets arranged in an array.

The illumination light WL having passed through the optical integration system 31 is incident on the polarization conversion element 32. The polarization conversion element 32 is formed of polarization separation films and retardation films. The polarization conversion element 32 converts the illumination light WL containing the non-polarized fluorescence YL into linearly polarized light.

The illumination light WL having passed through the polarization conversion element 32 enters the superimposing lens 33a. The superimposing lens 33a cooperates with the optical integration system 31 to homogenize the illuminance distribution of the illumination light WL in an area illuminated therewith. The illuminator 2 thus produces the illumination light WL.

Wavelength Conversion Element

The wavelength conversion element 40 includes a base 41 and a phosphor layer 42, as shown in FIG. 2, and has a non-rotating or fixed configuration. The base 41 has an upper surface 41a, which faces the first light collection system 26, and a lower surface 41b, which is opposite the upper surface 41a. The wavelength conversion element 40 further includes a reflection member 43, which is provided between the upper surface 41a and the phosphor layer 42, and a heat dissipation member 44, which is provided on the lower surface 41b. In the present embodiment, the phosphor layer 42 corresponds to the "wavelength conversion layer" set forth in the appended claims.

The base 41 is preferably made of a material that has high thermal conductivity and excels in heat dissipation performance. Examples of the material of the base 41 may include aluminum, copper, silver, or any other metal or an aluminum nitride, alumina, sapphire, diamond, or any other ceramic material. In the present embodiment, the base 41 is made of copper.

In the present embodiment, the phosphor layer 42 is held on the upper surface 41a of the base 41 via a bonding material that will be described later. The phosphor layer 42 converts part of the light incident thereon into the fluorescence YL, which then exits out of the phosphor layer 42. The reflection member 43 reflects the light incident from the phosphor layer 42 toward the first light collection system 26.

The heat dissipation member 44 is formed, for example, of a heat sink and has a structure having a plurality of fins. The heat dissipation member 44 is provided on the lower surface 41b of the base 41, which is the surface opposite the phosphor layer 42. The heat dissipation member 44 is fixed to the base 41, for example, by brazing-metal bonding (metal bonding). Since the wavelength conversion element 40 can dissipate heat via the heat dissipation member 44, thermal degradation of the phosphor layer 42 can be avoided, and a decrease in the conversion efficiency of the phosphor layer 42 due to an increase in the temperature thereof can be suppressed.

Figure 3:
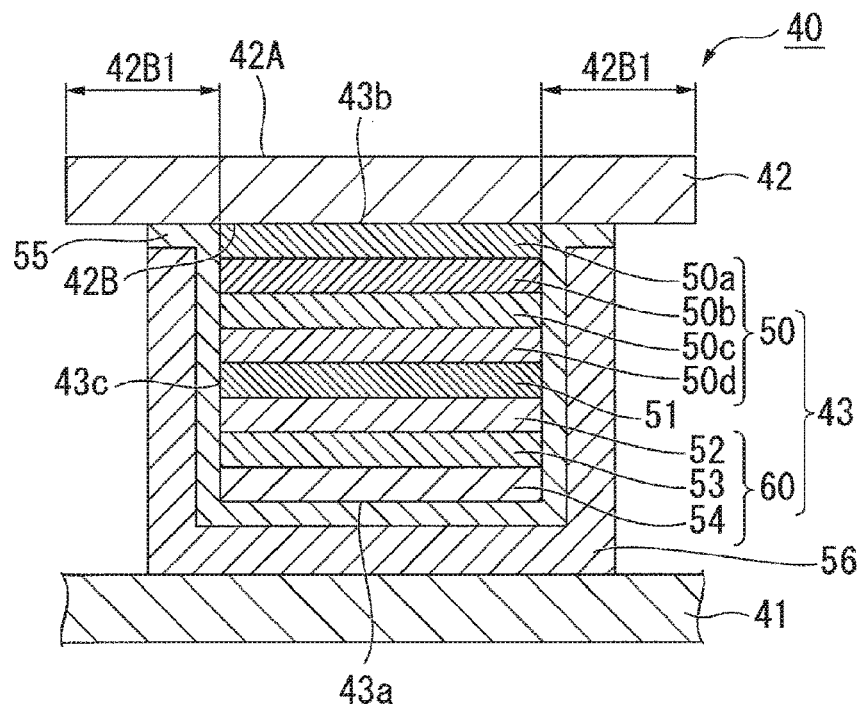
FIG. 3 is a cross-sectional view showing the configuration of a wavelength conversion element.

FIG. 3 is a cross-sectional view showing the configuration of key parts of the wavelength conversion element 40. In FIG. 3, the heat dissipation member 44 is omitted. The light beams $BL_S$, which exit out of the first light collection system 26 and enter the phosphor layer 42, are hereinafter referred to as excitation light $BL_S$.

The phosphor layer 42 has a light incident surface 42A, on which the excitation light $BL_S$ is incident and via which the fluorescence YL exits, and a surface being opposed to the light incident surface 42A, that is, a bottom surface 42B, on which the reflection member 43 is provided, as shown in FIG. 3. In the present embodiment, the phosphor layer 42 corresponds to the "wavelength conversion layer" set forth in the appended claims, the light incident surface 42A corresponds to the "first surface" set forth in the appended claims, and the bottom surface 42B corresponds to the "second surface" set forth in the appended claims.

In the present embodiment, the phosphor layer 42 is made of a ceramic phosphor formed of fired phosphor particles. A YAG (yttrium aluminum garnet) phosphor containing a Ce ion is used as the phosphor particles that form the phosphor layer 42. Since such a ceramic phosphor excels in heat resistance, the amount of excitation light incident on the phosphor layer 42 can be increased, whereby the amount of produced fluorescence can be increased. The phosphor layer 42 may have a plurality of pores provided therein. The plurality of pores allow the phosphor layer 42 to scatter light.

The phosphor particles may be made of one material or may be a mixture of particles made of two or more materials. The phosphor layer 42 is preferably, for example, a phosphor layer in which phosphor particles are dispersed in an inorganic binder, such as alumina, or a phosphor layer formed by firing a glass binder, which is an inorganic material, and phosphor particles.

The phosphor layer 42 with the reflection member 43 formed thereon is bonded to the base 41 via a bonding material 56. The reflection member 43 reflects part of the fluorescence YL, which is produced in the phosphor layer 42 and directed toward the bottom surface 42B, toward the light incident surface 42A. The reflection member 43 further reflects the excitation light $BL_S$ that has not been converted into the fluorescence YL in the phosphor layer 42 back into the phosphor layer 42.

Figure 4:
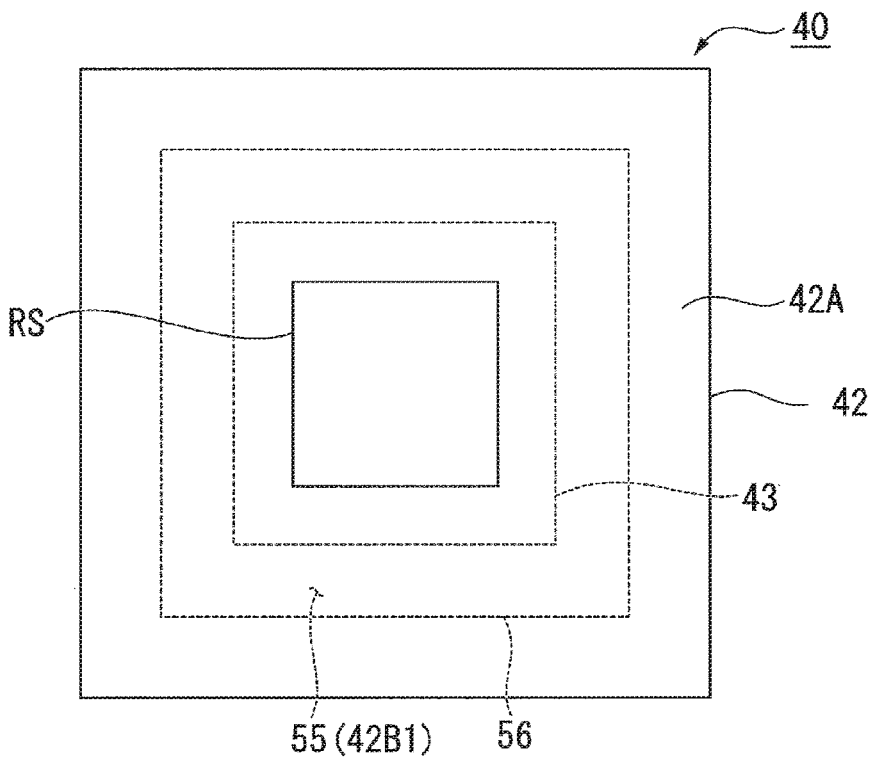
FIG. 4 is a plan view showing the configuration of the wavelength conversion element.

FIG. 4 is a plan view showing the configuration of key parts of the wavelength conversion element 40. FIG. 4 shows the light incident surface 42A of the phosphor layer 42 in a plan view viewed along the direction of a normal to the light incident surface 42A.

Figure 5:
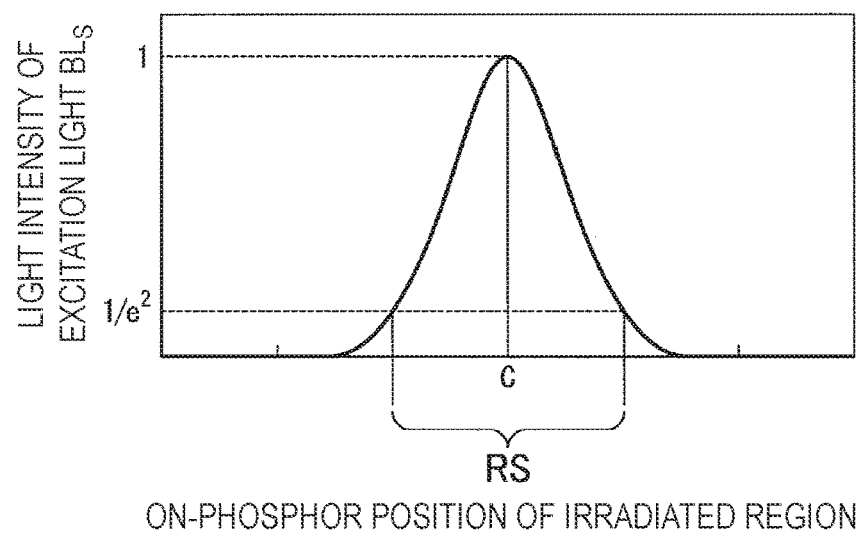
FIG. 5 shows an intensity distribution of excitation light.

The light incident surface 42A includes an excitation light irradiated region RS, on which the excitation light $BL_S$ is incident. The excitation light $BL_S$ has a Gaussian light intensity distribution, as shown in FIG. 5. In the present embodiment, the excitation light irradiated region RS described above is the area irradiated with a portion of the excitation light $BL_S$ that is the portion where the light intensity is the highest light intensity multiplied by $1/e^2$ (13.5%).

In the present embodiment, the area of the reflection member 43 is greater than the area of the excitation light irradiated region RS. That is, the reflection member 43 is provided on a portion of the bottom surface 42B that is the portion including a region that coincides in the plan view with the excitation light irradiated region RS. The reflection member 43 can thus satisfactorily reflects the excitation light $BL_S$ with which the excitation light irradiated region RS has been irradiated but which has not been converted into the fluorescence YL in the phosphor layer 42 and has reached the bottom surface 42B. The excitation light $BL_S$ therefore travels back into the phosphor layer 42, whereby the fluorescence YL is efficiently produced.

The wavelength conversion element 40 in the present embodiment includes a bonding assistance layer 55, which is provided between the reflection member 43 and the bonding material 56, as shown in FIG. 3. The bonding assistance layer 55 is a member that improves the reliability of the bonding between the reflection member 43 and the base 41 via the bonding material 56. The bonding material 56 is so provided as to face the bonding assistance layer 55. The base 41 is bonded to the bonding assistance layer 55 via the bonding material 56.

The reflection member 43 has a bottom surface 43a, an upper surface 43b, and a side surface 43c. The upper surface 43b faces the bottom surface 42B of the phosphor layer 42. The bottom surface 43a faces the bonding assistance layer 55. The side surface 43c is a surface that connects the bottom surface 43a and the upper surface 43b to each other. The bonding assistance layer 55 corresponds to the "first layer" set forth in the appended claims.

In the present embodiment, the bonding assistance layer 55 is disposed on the bottom surface 43a of the reflection member 43 and on a non-formation region 42B1 of the bottom surface 42B of the phosphor layer 42, which is the region where no reflection member 43 is provided (region that does not face reflection member 43). In the present embodiment, the bottom surface 43a corresponds to the "first region" set forth in the appended claims, and the non-formation region 42B1 corresponds to the "second region" set forth in the appended claims.

The bonding assistance layer 55 is made of a metal material having high affinity for the bonding material 56. That is, the material of the bonding assistance layer 55 is selected in accordance with the bonding material 56.

For example, in a case where a fired bonding material using nano-Ag particles is used as the material of the bonding material 56, the bonding assistance layer 55 is made of Ag.

In a case where a fired bonding material using nano-Cu particles is used as the material of the bonding material 56, the bonding assistance layer 55 is made of Cu.

In a case where a fired bonding material using nano-Au particles is used as the material of the bonding material 56, the bonding assistance layer 55 is made of Au.

In a case where AuSn-based solder or SnAgCu-based solder is used as the material of the bonding material 56, the bonding assistance layer 55 is formed of an Ni/Pt/Au plated layer or an Ni/Au plated layer.

Combining the bonding material 56 with the bonding assistance layer 55 as described above allows satisfactory bonding between the phosphor layer 42 (reflection member 43) and the base 41.

In the present embodiment, for example, the bonding material 56 is made of a fired bonding material using nano-Ag particles, and the bonding assistance layer 55 is made of Ag. Since a fired bonding material has high thermal conductivity, the thermal conductivity between the reflection member 43 and the base 41 is improved.

In the present embodiment, the bonding assistance layer 55 is provided on part of the non-formation region 42B1. Specifically, the bonding assistance layer 55 is so disposed as to expose an outer circumferential edge portion of the bottom surface 42B (non-formation region 42B1) of the phosphor layer 42.

The reflection member 43 in the present embodiment has a multilayer film structure including inorganic oxide layers. The multilayer film structure of the reflection member 43 will be described later. Since the reflection member 43 including the inorganic oxide layers has poorer heat dissipation performance than a metal material, the heat in the phosphor layer 42 is undesirably unlikely to transfer to the base 41 if the reflection member 43 is formed across the bottom surface 42B of the phosphor layer 42.

In contrast, the wavelength conversion element 40 according to the present embodiment has the region which is located between the bottom surface 42B of the phosphor layer 42 and the base 41 and where no reflection member 43 is provided (non-formation region 42B1). Since the phosphor layer 42 is bonded to the base 41 via the bonding assistance layer 55 and the bonding material 56 in the non-formation region 42B1, the heat in the phosphor layer 42 is efficiently dissipated toward the base 41 via the bonding assistance layer 55 and the bonding material 56.

Further, in the present embodiment, the bonding assistance layer 55 is so provided as to extend from the bottom surface 43a of the reflection member 43 via the side surface 43c thereof to the non-formation region 42B1, as shown in FIG. 3. The bonding assistance layer 55 is therefore satisfactorily disposed at the corners of the reflection member 43 (portion where bottom surface 43a is connected to side surface 43c or portion where side surface 43c is connected to bottom surface 42B of phosphor layer 42). The bonding material 56 is therefore satisfactorily bonded to the corners of the reflection member 43 via the bonding assistance layer 55.

The bottom surface 42B of the phosphor layer 42 and the reflection member 43 are securely bonded to the base 41 via the bonding assistance layer 55 and the bonding material 56. Further, since the side surface 43c and the bottom surface 43a are in contact with the bonding assistance layer 55, a large area where the reflection member 43 is bonded to the bonding assistance layer 55 can be ensured. The reflection member 43 is therefore likely to dissipate heat toward the base 41 via the bonding assistance layer 55 and the bonding material 56. That is, the heat dissipation performance of the reflection member 43 is improved.

The configuration of the reflection member 43 will subsequently be described. The reflection member 43 has a structure in which a multilayer film 50, a reflection layer 51, and a protective layer 60 are layered on each other sequentially from the side facing the bottom surface 42B of the phosphor layer 42, as shown in FIG. 3.

The multilayer film 50 is layers each containing an inorganic oxide and includes a total reflection layer 50a, which totally reflects light incident at an angle greater than or equal to the critical angle out of the fluorescence YL produced in the phosphor layer 42, and reflection enhancement layers 50b, 50c, and 50d. The reflection enhancement layers 50b, 50c, and 50d are intended to provide a reflection enhancement effect and improve the efficiency of extraction of the fluorescence YL.

In the present embodiment, the total reflection layer 50a is made, for example, of $SiO_2$. Using $SiO_2$ allows satisfactory total reflection of the fluorescence YL. The reflection enhancement layer 50b is made of $TiO_2$, the reflection enhancement layer 50c is made of $SiO_2$, and the reflection enhancement layer 50d is made of $Al_2O_3$. The multilayer film 50 is therefore made of inorganic oxides.

In the present embodiment, the reflection layer 51 is so provided as to face the multilayer film 50. The reflection layer 51 is so provided as to be in contact with or layered on the multilayer film 50. Specifically, the reflection layer 51 is so provided as to be in contact with or layered on the reflection enhancement layer 50d of the multilayer film 50. The multilayer film 50 is so provided between the phosphor layer 42 and the reflection layer 51 as to be in contact therewith or layered thereon.

The reflection layer 51 reflects part of the fluorescence YL, which is produced in the phosphor layer 42 and directed toward the bottom surface 42B, toward the light incident surface 42A. The reflection layer 51 further reflects the excitation light $BL_S$ that has entered the phosphor layer 42 but has not been converted into the fluorescence YL and has entered the reflection member 43 in such a way that the excitation light $BL_S$ travels back into the phosphor layer 42. The fluorescence YL can thus be efficiently produced.

The reflection layer 51 is made of Ag (silver) or Al (aluminum). In the present embodiment, the reflection layer 51 is made of Ag, which has higher reflectance than Al.

The protective layer 60 is intended to suppress degradation of the reflection layer 51 by protecting the reflection layer 51. In the present embodiment, the protective layer 60 includes a first metal layer 52, an inorganic oxide layer 53, and a second metal layer 54.

The first metal layer 52 is so provided as to face the reflection layer 51. The first metal layer 52 is so provided as to be in contact with or layered on the reflection layer 51. The reflection layer 51 is so provided between the multilayer film 50 (reflection enhancement layer 50d) and the first metal layer 52 as to be in contact therewith or layered thereon. The first metal layer 52 is so provided as to be in intimate contact with the reflection layer 51. Separation between the reflection layer 51 and the protective layer 60 is therefore unlikely to occur.

The first metal layer 52 is made, for example, of any one of Ni, Cr, Co, Mo, Cu, Zn, Al, Ti, and Fe.

Ag, which forms the reflection layer 51, is a face-centered-cubic crystal. The first metal layer 52 is therefore desirably made of a material having the same crystal structure as that of Ag. Out of the metal materials described above, Ni and Cu have the same crystal structure as that of Ag. In the present embodiment, the first metal layer 52 is made, for example, of Ni. The first metal layer 52 made of a material having the same crystal structure as that of Ag is unlikely to disturb the crystallinity of the Ag film, whereby the reflectance of the reflection layer 51 can be increased.

The inorganic oxide layer 53 is so provided as to face the first metal layer 52. The inorganic oxide layer 53 is so provided as to be in contact with or layered on the first metal layer 52. The first metal layer 52 is so provided between the reflection layer 51 and the inorganic oxide layer 53 as to be in contact therewith or layered thereon. The inorganic oxide layer 53 has the function of preventing ions and oxygen from diffusing toward the phosphor layer 42. The inorganic oxide layer 53 can be made, for example, of any of $Al_2O_3$, $SiO_2$, and $TiO_2$.

In the present embodiment, the inorganic oxide layer 53 is made of $Al_2O_3$. $Al_2O_3$, which has a minute crystal structure, excels in the function of trapping ions and oxygen produced in the bonding material 56.

The second metal layer 54 is so provided as to face the inorganic oxide layer 53. The second metal layer 54 is so provided as to be in contact with or layered on the inorganic oxide layer 53. The inorganic oxide layer 53 is so provided between the first metal layer 52 and the second metal layer 54 as to be in contact therewith or layered thereon. The second metal layer 54 has the function of reducing stress induced in the bonding material 56, as will be described later. The second metal layer 54 is made, for example, of any one of Cr, Ni, Co, Mo, Cu, Zn, Al, Ti, and Fe.

The second metal layer 54 is made of a metal that forms a passive-state coating. Out of the metal materials described above, for example, Al, Cr, and Ti each form a passive-state coating. In the present embodiment, the second metal layer 54 is made, for example, of Cr. The thickness of the Cr layer is set, for example, at about 100 nm. Using a metal material that forms a passive-state coating as the material of the second metal layer 54 allows improvement in the performance of protecting the reflection layer 51.

As described above, the wavelength conversion element 40 according to the present embodiment allows the heat in the phosphor layer 42 and the reflection member 43 to efficiently transfer toward the base 41 as compared with the configuration in which the reflection member 43 is provided across the bottom surface 42B. The wavelength conversion element 40 according to the present embodiment therefore suppresses a decrease in the fluorescence conversion efficiency due to an increase in the temperature of the phosphor layer 42, whereby high-illuminance illumination light WL can be produced.

Further, the heat dissipation performance of the phosphor layer 42 is increased, whereby the size of the heat dissipation member 44 can be reduced. As a result, the size of the wavelength conversion element 40 itself can be reduced.

The light source apparatus 2A including the wavelength conversion element 40 can therefore be a light source apparatus with the loss of the fluorescence YL reduced. Further, the projector 1 according to the present embodiment, which includes the illuminator 2 using the light source apparatus 2A described above, can form a high-luminance image.

Second Embodiment

A second embodiment of the invention will subsequently be described. In the present embodiment, a method for manufacturing the wavelength conversion element 40 according to the first embodiment will be described.

FIGS. 6A to 6E show the steps of manufacturing the wavelength conversion element 40.

Figure 6A:
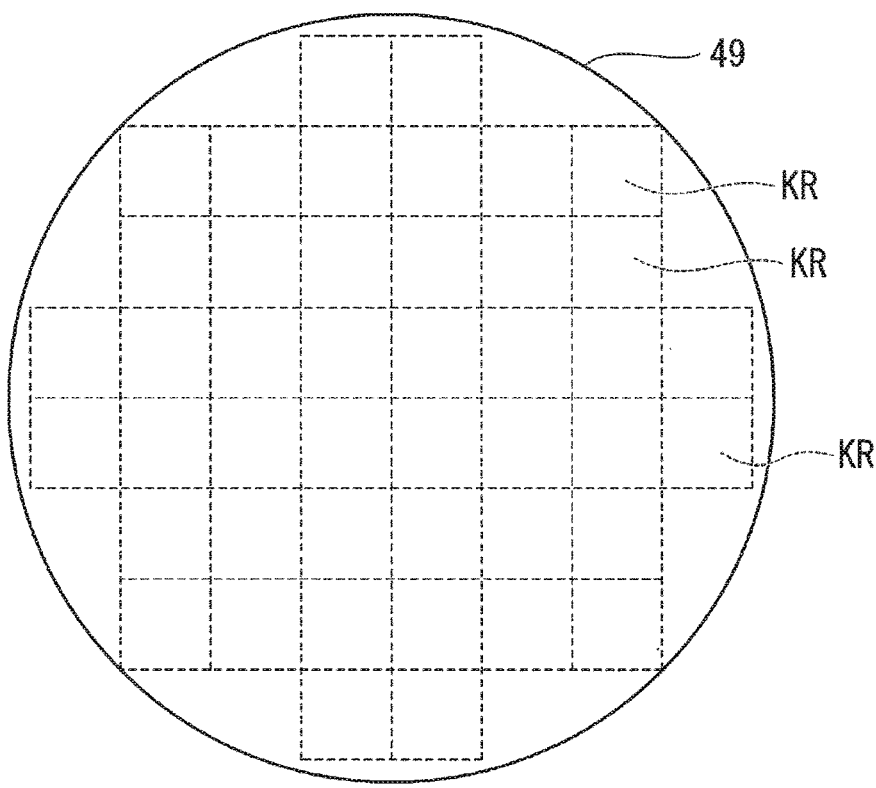
FIG. 6A shows a wavelength conversion element manufacturing step according to a second embodiment.

A phosphor substrate 49 for forming the phosphor layer 42 will first be provided, as shown in FIG. 6A. The phosphor substrate 49 has a disc-like shape.

The phosphor substrate 49 is manufactured by preparing a mixture formed of the phosphor particles and an organic substance that form the phosphor layer 42 and firing the mixture at a predetermined temperature. The phosphor substrate 49 is so sized as to contain a plurality of phosphor member formation regions KR. The opposite surfaces of the phosphor substrate 49 are ground and polished as required. The phosphor substrate 49 corresponds to the "wavelength conversion member formation substrate" set forth in the appended claims.

A plurality of island-shaped reflection members 43 are subsequently formed on one surface 49a of the phosphor substrate 49 (reflection member formation step). The reflection members 43 are formed on the phosphor member formation regions KR (see FIG. 6A) provided on the one surface 49a. Gaps S are therefore created between the plurality of reflection members 43.

Figure 6B:
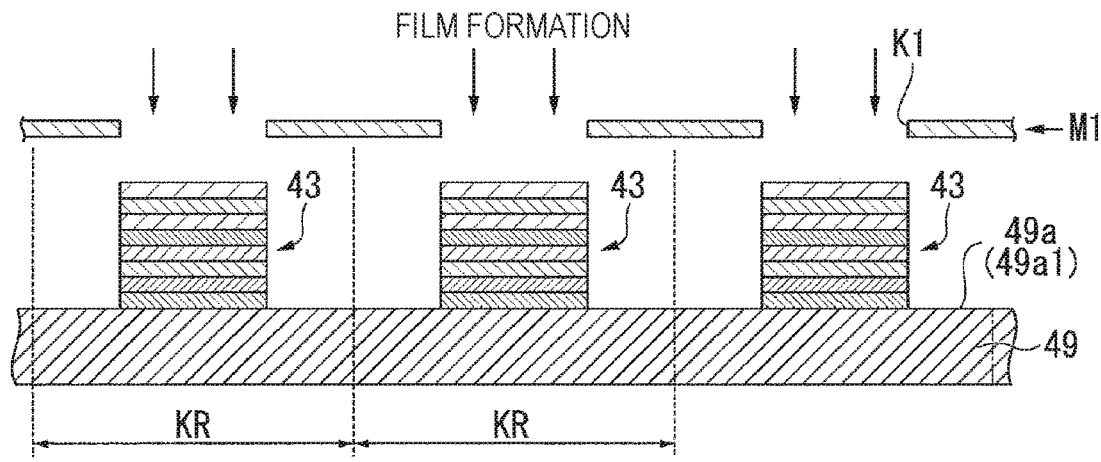
FIG. 6B shows a wavelength conversion element manufacturing step according to the second embodiment.
Figure 6C:
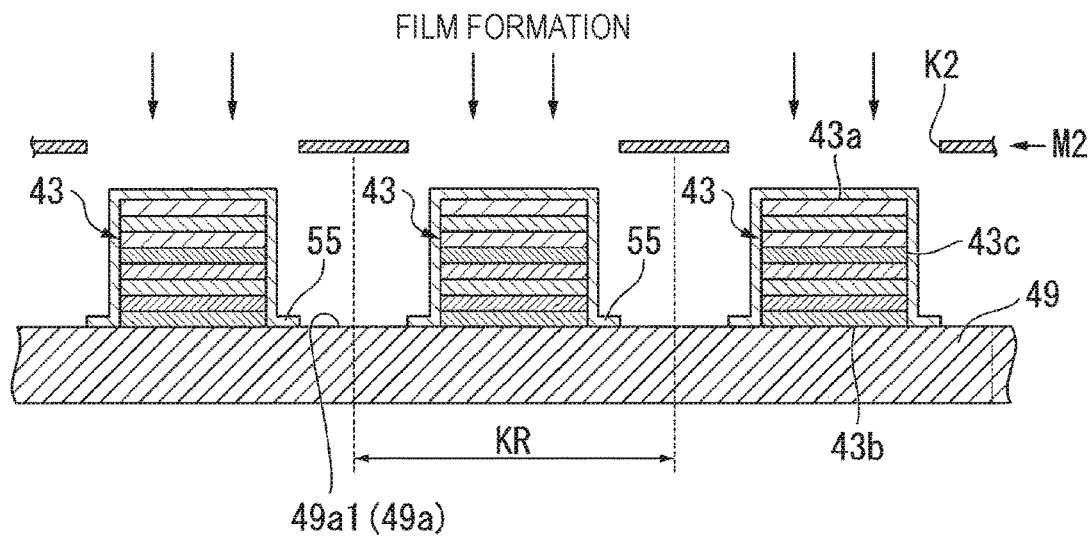
FIG. 6C shows a wavelength conversion element manufacturing step according to the second embodiment.

Specifically, a first mask M1 having a plurality of openings K1 corresponding to the phosphor member formation regions KR is used to successively form the layers described above on each of the phosphor member formation regions KR in an evaporation, sputtering, or any other process to form the reflection member 43 in the phosphor member formation region KR, as shown in FIG. 6B. The plurality of reflection members 43 are thus so formed on the one surface 49a of the phosphor substrate 49 in the form of dispersed islands. That is, the one surface 49a of the phosphor substrate 49 has a non-formation region 49a1, where no reflection member 43 is formed.

The bonding assistance layer 55 is subsequently formed in the regions that face the reflection members 43 (bottom surfaces 43a of reflection members 43) and in a region of the one surface 49a of the phosphor substrate 49 that is the region where no reflection member 43 has been formed (non-formation region 49a1) (first layer formation step).

Specifically, a second mask M2 having a plurality of openings K2 is used to deposit Ag, which is the material of the bonding assistance layer 55, in an evaporation, sputtering, or any other process to form the bonding assistance layers 55. The second mask M2 and the first mask M1 have the same configuration except that the openings in the two masks have sizes different from each other.

That is, the first mask M1 and the second mask M2 have the same number of openings and the same interval between the openings. The size of the openings K2 of the second mask M2 is greater than the size of the openings K1 of the first mask M1. Use of the thus configured second mask M2 allows the bonding assistance layers 55 to each be so formed as to extend from the bottom surface 43a of the reflection member 43 via the side surface 43c thereof to the non-formation region 49a1 of the phosphor substrate 49 (one surface 49a). The bottom surface 43a corresponds to the "third region" set forth in the appended claims, and the non-formation region 49a1 corresponds to the "fourth region" set forth in the appended claims.

The size of the openings K2 of the second mask M2 is smaller than the size of the phosphor member formation regions KR. The bonding assistance layers 55 are therefore so formed as not to extend off the phosphor member formation regions KR.

Figure 6D:
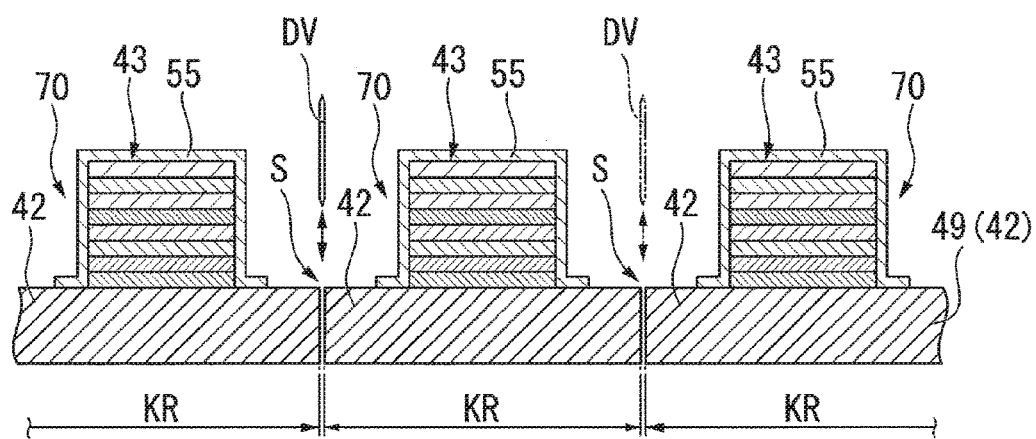
FIG. 6D shows a wavelength conversion element manufacturing step according to the second embodiment.

The phosphor substrate 49 is subsequently cut at the gaps S provided between the plurality of reflection members 43 (cutting step). Specifically, a plurality of phosphor members 70 are formed by cutting the phosphor substrate 49 along dicing lines provided in the gaps S (outer shape of each of phosphor member formation regions KR) with a dicing blade DV, as shown in FIG. 6D. The phosphor members 70 each correspond to the "wavelength conversion member" set forth in the appended claims.

Since the phosphor members 70 are each so configured that the side surface 43c of the reflection member 43 is covered with the bonding assistance layer 55, damage of the side surface 43c of the reflection member 43 due to chips produced when the phosphor substrate 49 is diced and other problems are avoided.

Figure 6E:
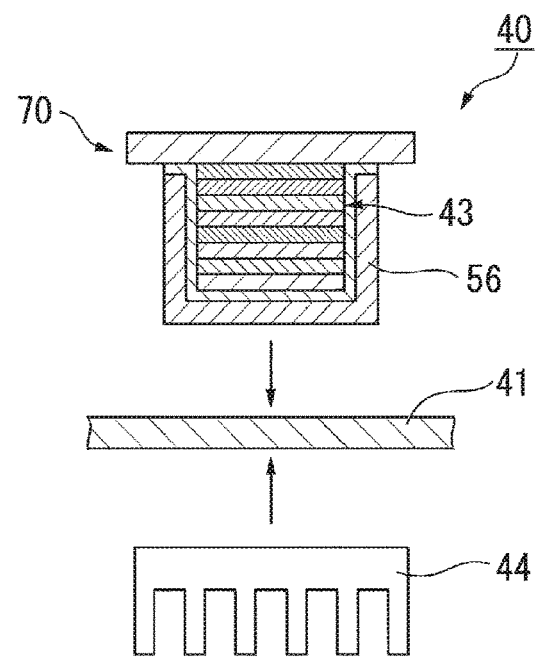
FIG. 6E shows a wavelength conversion element manufacturing step according to the second embodiment.

The phosphor members 70 are each subsequently fixed to the base 41 via the bonding material 56 (fixing step), as shown in FIG. 6E. The heat dissipation member 44 is finally fixed to a surface of the base 41 that is the surface opposite the phosphor layer 42. The wavelength conversion element 40 is thus manufactured.

In the manufacturing method according to the present embodiment, since no reflection member 43 is formed on the dicing lines (outer shape of each of phosphor member formation regions KR) before the dicing, separation of the reflection members 43 off the phosphor substrate 49 can be avoided in the dicing process. A decrease in the yield of the wavelength conversion elements 40 due to the separation of the reflection members 43 is therefore suppressed. As a result, the yield of the wavelength conversion element 40 can be improved.

In a case where the bonding assistance layer and the reflection member are individually formed on each of a plurality of cut phosphor layers, the phosphor layers each need to be placed in a film formation apparatus, and the wavelength conversion elements cannot be efficiently manufactured.

In contrast, in the manufacturing method according to the present embodiment, after the bonding assistance layers 55 and the reflection members 43 are formed on the phosphor substrate 49, the base 41 is bonded to each of the phosphor members, which are produced by cutting the phosphor substrate 49, whereby the wavelength conversion elements 40 can be efficiently manufactured.

First Variation

A wavelength conversion element according to a variation of the first embodiment will subsequently be described as a first variation. Members common to those in the first embodiment have the same reference characters and will not be described in detail.

Figure 7:
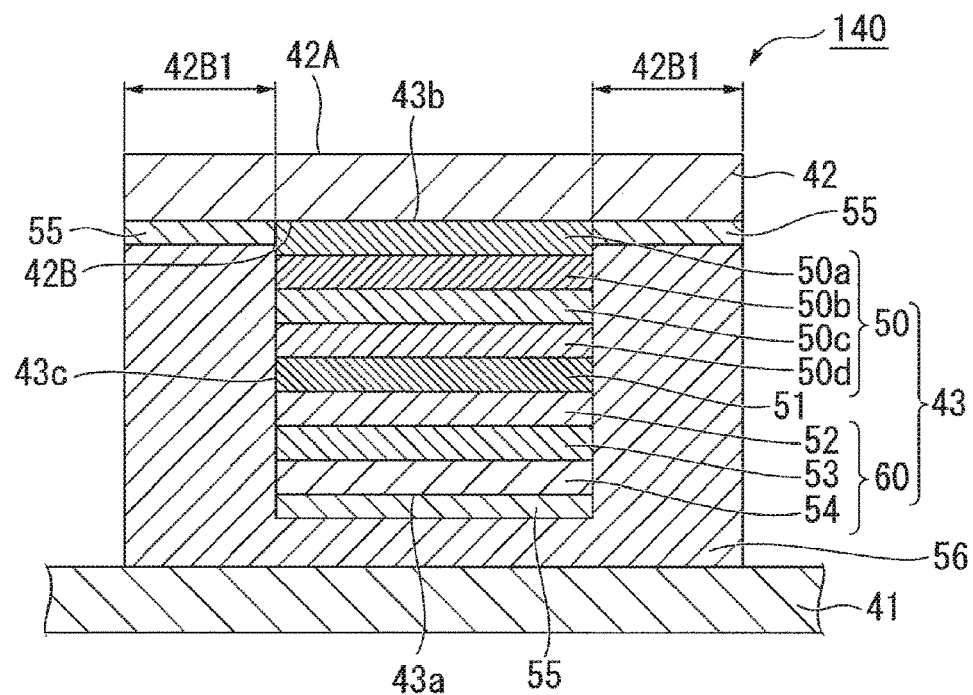
FIG. 7 is a cross-sectional view showing the configuration of a wavelength conversion element according to a first variation.

FIG. 7 is a cross-sectional view showing the configuration of key parts of a wavelength conversion element 140 according to the present variation.

In the wavelength conversion element 140, the bonding assistance layer 55 is disposed on the bottom surface 43a of the reflection member 43 and on the non-formation region 42B1 of the bottom surface 42B of the phosphor layer 42, as shown in FIG. 7. The bonding assistance layer 55 is so disposed as to completely cover the bottom surface 42B (non-formation region 42B1) of the phosphor layer 42. Further, the configuration of the wavelength conversion element 140 in the present variation differs from the configuration of the wavelength conversion element 40 according to the first embodiment in that the bonding assistance layer 55 is so provided as to expose the side surface 43c of the reflection member 43.

The wavelength conversion element 140 according to the present variation also allows the heat in the phosphor layer 42 and the reflection member 43 to efficiently transfer toward the base 41 as compared with the configuration in which the reflection member 43 is provided across the bottom surface 42B. The wavelength conversion element 140 according to the present variation therefore suppresses a decrease in the fluorescence conversion efficiency due to an increase in the temperature of the phosphor layer 42, whereby high-illuminance illumination light WL can be produced.

Second Variation

A wavelength conversion element manufacturing method according to a variation of the second embodiment will subsequently be described as a second variation. Members common to those in the second embodiment have the same reference characters and will not be described in detail.

Figure 8:
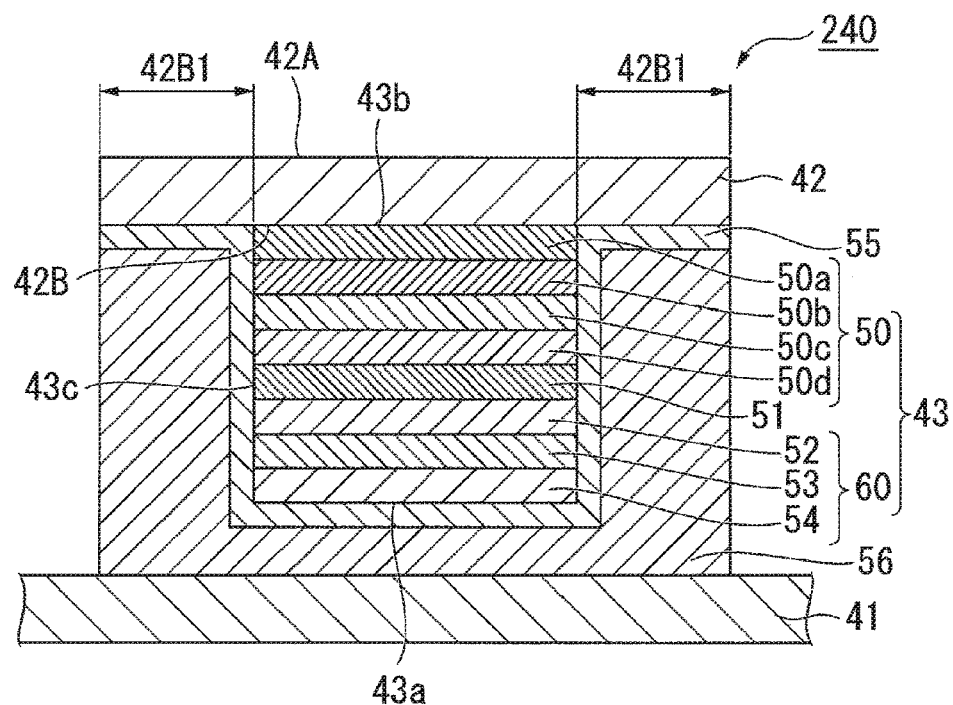
FIG. 8 is a cross-sectional view showing the configuration of a wavelength conversion element manufactured by using a manufacturing method according to a second variation.

Before the description of the manufacturing method according to the present variation, a wavelength conversion element manufactured by using the present manufacturing method will first be described. FIG. 8 is a cross-sectional view showing the configuration of key parts of a wavelength conversion element 240 manufactured by using the manufacturing method according to the second variation.

The configuration of the wavelength conversion element 240 differs from the configuration of the wavelength conversion element 40 according to the first embodiment described above in that the bonding assistance layer 55 is provided across the non-formation region 42B1, as shown in FIG. 8. Further, in the present variation, the bonding assistance layer 55 is so provided as to extend from the bottom surface 43a of the reflection member 43 via the side surface 43c thereof to the non-formation region 42B1.

Figure 9A:
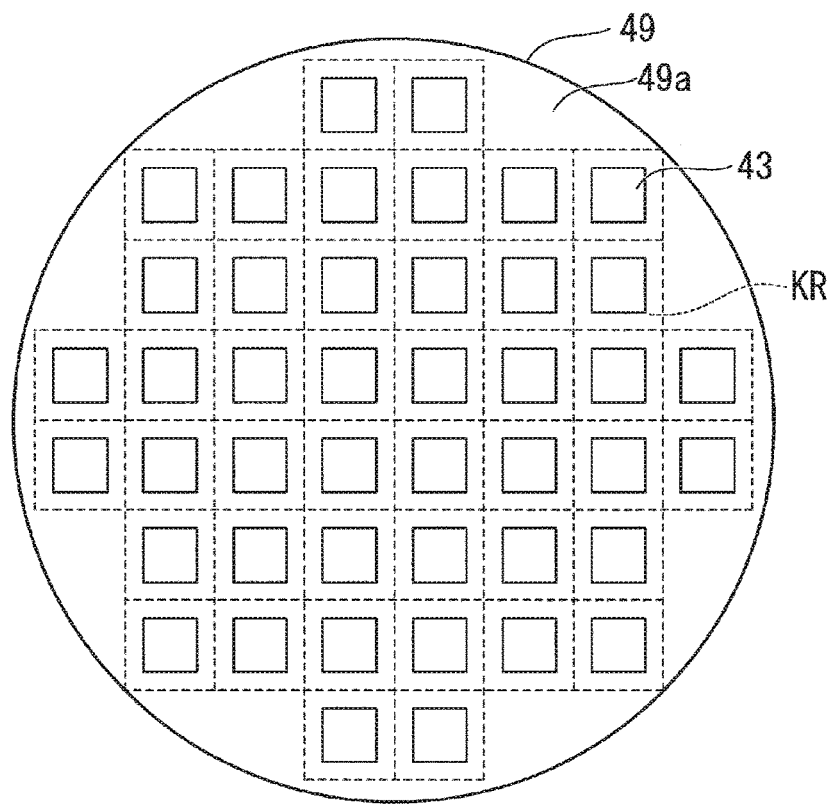
FIG. 9A shows a wavelength conversion element manufacturing step according to the second variation.

FIG. 9A to 9D show manufacturing steps of the wavelength conversion element 240. A plurality of island-shaped reflection members 43 are first formed on the one surface 49a of the phosphor substrate 49 (reflection member formation step), as shown in FIG. 9A. The reflection members 43 are formed on the phosphor member formation regions KR provided on the one surface 49a. The gaps S are therefore created between the plurality of reflection members 43.

Specifically, the first mask M1 having a plurality of openings K1 corresponding to the phosphor member formation regions KR is used to successively form the layers described above on each of the phosphor member formation regions KR in an evaporation, sputtering, or any other process to form the reflection member 43 in the phosphor member formation region KR (see FIG. 6B).

Figure 9B:
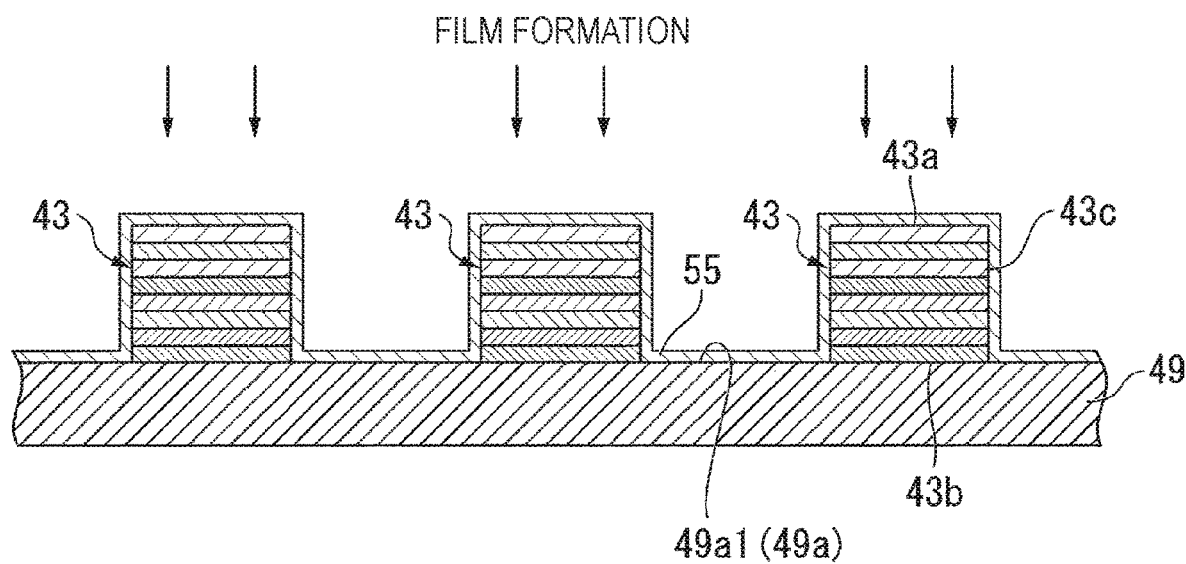
FIG. 9B shows a wavelength conversion element manufacturing step according to the second variation.

Ag, which is the material of the bonding assistance layer 55, is subsequently deposited with no use of a mask in an evaporation, sputtering, or any other process to form the bonding assistance layer 55, as shown in FIG. 9B. Each portion of the bonding assistance layer 55 is therefore so formed as to extend from the bottom surface 43a of the reflection member 43 via the side surface 43c thereof to the non-formation region 49a1 of the phosphor substrate 49 (one surface 49a). Further, the bonding assistance layer 55 is formed across the non-formation region 49a1. The bonding assistance layer 55 is therefore formed on the gaps S (non-formation region 49al) provided between the plurality of reflection members 43. As described above, in the present variation, no mask is required in the step of forming the bonding assistance layer 55, whereby the manufacturing steps can be simplified.

The phosphor substrate 49 is subsequently cut at the gaps S provided between the plurality of reflection members 43 (cutting step).

Figure 9C:
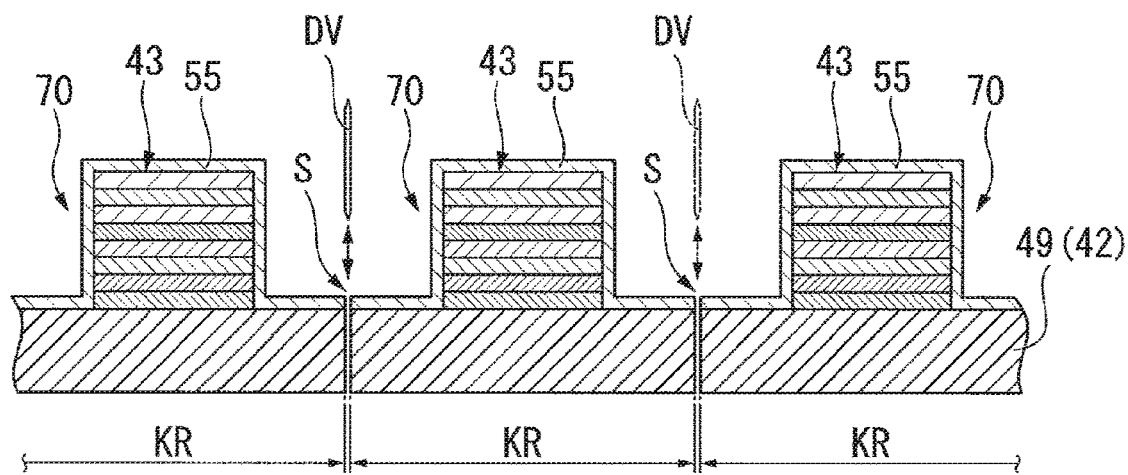
FIG. 9C shows a wavelength conversion element manufacturing step according to the second variation.

Specifically, a plurality of phosphor members 70 are formed by cutting the phosphor substrate 49 along the dicing lines provided in the gaps S (outer shape of each of phosphor member formation regions KR shown in FIG. 9A) with the dicing blade DV, as shown in FIG. 9C.

In the present variation, since no mask is used in the step of forming the bonding assistance layer 55, the bonding assistance layer 55 is formed also on the dicing lines. The bonding assistance layer 55 is therefore cut when the phosphor substrate 49 is cut.

The bonding assistance layer 55 is made of a metal material (Ag film) having high affinity for the bonding material 56. Since the bonding assistance layer 55 made of such a metal material has smaller film stress than the reflection members 43 each including the inorganic oxide layers, separation between the bonding assistance layer 55 and the reflection members 43 is unlikely to occur even when they are cut in the dicing process.

Since no reflection member 43 is formed on the dicing lines (outer shape of each of phosphor member formation regions KR), separation of the reflection members 43 off the phosphor substrate 49 when they are diced can be avoided.

Since the side surface 43c of each of the reflection members 43 is covered with the bonding assistance layer 55, damage of the side surface 43c of each of the reflection members 43 due to chips produced when the phosphor substrate 49 is diced and other problems can be avoided.

Figure 9D:
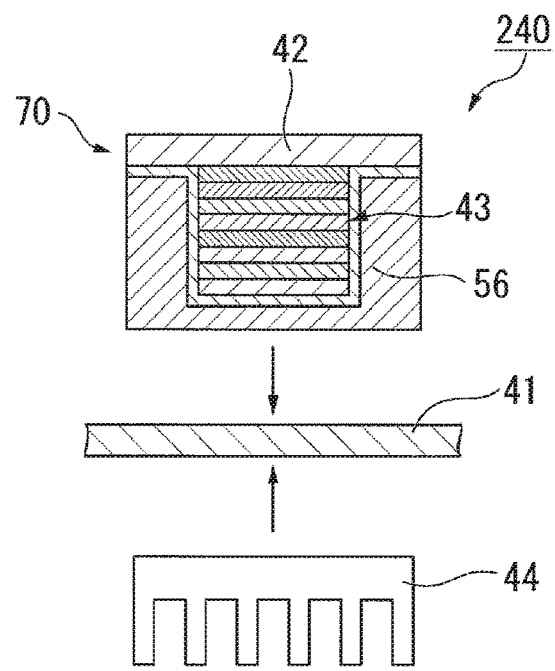
FIG. 9D shows a wavelength conversion element manufacturing step according to the second variation.

The plurality of phosphor members 70 are each subsequently fixed to the base 41 via the bonding material 56 (bonding step), as shown in FIG. 9D. The heat dissipation member 44 is finally fixed to a surface of the base 41 that is the surface opposite the phosphor layer 42. The wavelength conversion element 240 is thus manufactured.

The manufacturing method according to the present variation can thus suppress a decrease in the yield of the wavelength conversion elements 240 due to the separation of the reflection members 43 and a decrease in the yield due to the separation of the bonding assistance layer 55. As a result, the yield of the wavelength conversion element 240 can be improved.

Third Variation

A variation of the reflection member will subsequently be described as a third variation. Members common to those in the embodiments described above have the same reference characters and will not be described in detail.

Figure 10:
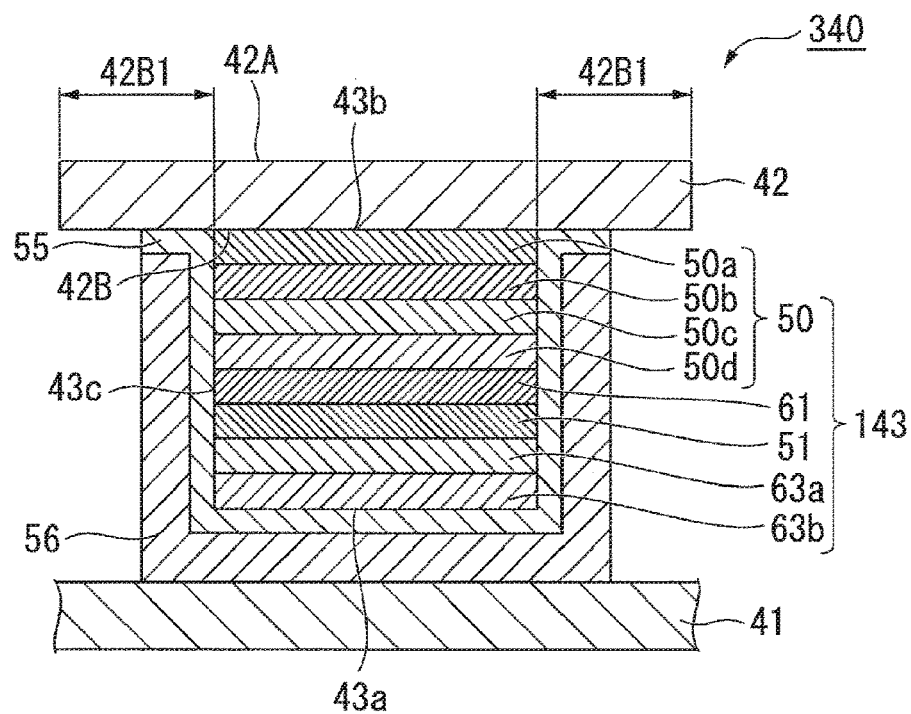
FIG. 10 shows a cross-sectional configuration of a reflection member according to a third variation.

FIG. 10 shows a cross-sectional configuration of a wavelength conversion element 340 including a reflection member 143 according to the third variation. In FIG. 10, the heat dissipation member 44 is omitted.

The reflection member 143 is formed of the multilayer film 50, a degradation prevention film 61, the reflection layer 51, a first protective layer 63a, and a second protective layer 63b sequentially disposed from the side facing the bottom surface 42B of the phosphor layer 42 and layered on each other, as shown in FIG. 10.

The degradation prevention film 61 is formed of a layer containing a metal. The degradation prevention film 61 is intended to suppress degradation of the reflection layer 51. The degradation prevention film 61 contains at least one type of metal (first metal) selected, for example, from Al, Ni, Ti, W, and Nb. The film thickness of the degradation prevention film 61 is set, for example, at a value ranging from about 0.1 to 5 nm. The reason for this is that when the film thickness is smaller than 0.1 nm, the effect of preventing degradation of the reflection layer 51 decreases, whereas when the film thickness is greater than 5 nm, the optical transmittance decreases.

In the case where the reflection layer 51 is made of Ag, the degradation prevention film 61 contains at least one type of metal selected, for example, from Al, Ni, Ti, W, and Nb. In the case where the reflection layer 51 is made of Al, the degradation prevention film 61 contains at least one type of metal selected, for example, from Ni, Ti, W, and Nb.

The cohesive energy of the element (Ti, for example) that forms the degradation prevention film 61 is greater than the cohesive energy of the element (Ag, for example) that forms the reflection layer 51. The state in which the cohesive energy is large means that a large amount of energy is required for occurrence of cohesion.

In the reflection layer 51, which has a light-incident-side portion made of Ti, which has large cohesive energy, the effect of Ti causes heat-induced Ag atom migration to be unlikely to occur, so that occurrence of migration-induced cohesion is suppressed. That is, a decrease in reflectance of the reflection layer 51, and a decrease in durability thereof due to occurrence of cohesion are suppressed. The reflection member 143 including the degradation prevention film 61 can reduce degradation of the reflection layer 51.

The first protective layer 63a and the second protective layer 63b have the function of protecting the reflection layer 51. The first protective layer 63a is formed of a film containing a metal. The first protective layer 63a is formed, for example, of an Ni film, facilitates crystallization of the reflection layer 51 (Ag film), and can therefore improve the durability thereof.

The first protective layer 63a may be formed of a film containing the same metal contained in the degradation prevention film 61. That is, in the case where the degradation prevention film 61 is made of Ti, the first protective layer 63a may be made of Ti.

The second protective layer 63b is formed of a layer containing an inorganic oxide. The second protective layer 63b is made, for example, of $Al_2O_3$ and can suppress oxidation of the reflection layer 51 (Ag film) and improve the intimate adhesion with the bonding assistance layer 55.

In a case where the multilayer film 50 is made of $SiO_2$, $TiO_2$, or $Al_2O_3$, the second protective layer 63b may be made of a material different from these materials.

As described above, according to the reflection member 143, the degradation prevention film 61 suppresses degradation of the reflection layer 51 formed of an Ag film due to cohesion therein, as shown in FIG. 10. Therefore, since a decrease in the reflectance of the reflection layer 51 due to the degradation thereof is unlikely to occur, a component of the fluorescence YL produced in the phosphor layer 42 that is the component incident on the bottom surface 42B can be satisfactorily reflected off the reflection layer 51 and outputted via the light incident surface 42A. A decrease in the efficiency of extraction of the fluorescence YL can therefore be suppressed.

Using an Ni film as the metal film that forms the first protective layer 63a, which protects the reflection layer 51, allows facilitation of crystallization of the reflection layer 51 (Ag film) and improvement in the durability thereof.

Using $Al_2O_3$ as the inorganic oxide that forms the second protective layer 63b, which protects the reflection layer 51, can suppress oxidation of the reflection layer 51 (Ag film) and improve the intimate adhesion with the bonding assistance layer 55.

The invention is not limited to the contents of the embodiments described above but can be changed as appropriate to the extent that the change does not depart from the substance of the invention.

Further, the above-mentioned first embodiment has been described with reference to the case where the light source apparatus according to the first embodiment of the invention is incorporated in a projector, but not necessarily. The light source apparatus according to the first embodiment of the invention may be used as a lighting apparatus, a headlight of an automobile, and other components.

The entire disclosure of Japanese Patent Application No. 2017-238796, filed on Dec. 13, 2017 is expressly incorporated by reference herein.

What is claimed is:

1. A wavelength conversion element comprising:
   a wavelength conversion layer having a first surface including an excitation light irradiated region irradiated with excitation light and a second surface being opposed to the first surface, the wavelength conversion layer wavelength-converting the excitation light into converted light having a wavelength different from a wavelength of the excitation light;
   a reflection member provided on a portion of the second surface that is a portion including a region that coincides in a plan view with the excitation light irradiated region when the first surface is viewed in a direction of a normal thereto, the reflection member including an inorganic oxide layer and reflecting the excitation light and the converted light;

a first layer disposed in a first region that faces the reflection member and in a second region that does not face the reflection member on the second surface of the wavelength conversion layer;

a bonding material so provided as to face the first layer; and a base bonded to the first layer via the bonding material.

2. The wavelength conversion element according to claim 1, wherein the first layer is so provided as to extend from the first region via a side surface of the reflection member to the second region.

3. A light source apparatus comprising:

the wavelength conversion element according to claim 1; and a light source that outputs light toward the wavelength conversion element.

4. A light source apparatus comprising:

the wavelength conversion element according to claim 2; and a light source that outputs light toward the wavelength conversion element.

5. A projector comprising:

the light source apparatus according to claim 3;

a light modulator that modulates light from the light source apparatus in accordance with image information to produce image light; and a projection system that projects the image light.

6. A projector comprising:

the light source apparatus according to claim 4;

a light modulator that modulates light from the light source apparatus in accordance with image information to produce image light; and a projection system that projects the image light.

7. A method for manufacturing a wavelength conversion element, the method comprising:

forming a plurality of reflection members on one surface of a wavelength conversion member formation substrate including wavelength conversion particles that wavelength-convert excitation light, the reflection members reflecting the excitation light and light into which the excitation light is wavelength-converted by the wavelength conversion particles;

forming a first layer in a third region that faces the reflection member and in a fourth region that does not face the reflection member on the one surface of the wavelength conversion member formation substrate;

cutting the wavelength conversion member formation substrate at gaps provided between the plurality of reflection members to form a plurality of wavelength conversion members; and bonding each of the wavelength conversion members to a base via a bonding material.

8. The method for manufacturing a wavelength conversion element according to claim 7, wherein in the first layer formation, the first layer is so formed as to extend from the third region via a side surface of the reflection member to the fourth region.

9. The method for manufacturing a wavelength conversion element according to claim 7, wherein in the bonding, a metal material is used as a material of the bonding material, and in the first layer formation, a metal material is used as a material of the first layer, and the first layer is formed across the fourth region.

10. The method for manufacturing a wavelength conversion element according to claim 8, wherein in the bonding, a metal material is used as a material of the bonding material, and in the first layer formation, a metal material is used as a material of the first layer, and the first layer is formed across the fourth region.

* * * * *